United States Patent [19]

Kopp

[11] 4,323,774
[45] Apr. 6, 1982

[54] CIRCUIT FOR REFLECTIVE MODE OPTICAL READER

[75] Inventor: Arthur R. Kopp, Lewisberry, Pa.

[73] Assignee: AMP Incorporated, Harrisburg, Pa.

[21] Appl. No.: 155,906

[22] Filed: Jun. 2, 1980

[51] Int. Cl.³ .............................................. H01J 40/14
[52] U.S. Cl. ................................ 250/214 A; 307/311
[58] Field of Search .............. 250/214 A, 214 R, 557; 307/311

[56] References Cited

U.S. PATENT DOCUMENTS 3,706,874 12/1972 Lockard .
3,774,015 11/1973 Lockard .

Primary Examiner—David C. Nelms
Assistant Examiner—Darwin R. Hostetter
Attorney, Agent, or Firm—Russell J. Egan

[57] ABSTRACT

A detection circuit is disclosed for use in reflective mode optical mark readers employing LED's as light sources. The subject circuit includes a bias network which sets a contrast threshold for detection and which compensates for temperature variations. The subject detection circuit is ratio dependent rather than magnitude dependent thereby obviating problems which can arise from light sources of different intensities.

6 Claims, 2 Drawing Figures

CIRCUIT FOR REFLECTIVE MODE OPTICAL READER

BACKGROUND OF THE INVENTION

1. The Field Of The Invention

The present invention relates to a detector circuit for reflective mode optical mark readers and in particular to a detector circuit capable of operation in conjunction with a low level light source.

2. The Prior Art

It is well established that detecting diffusely reflected light through a suitable optical system works well for reading hand marked or printed data on paper. Many sources are in use for illumination in such readers. For example, incandescent lamps with optical filters and lenses supply relatively large amounts of light making detection problems rather easy.

The use of ordinary, readily available light emitting diodes for such readers is desirable from an economic standpoint. However, reflected light levels from LED'S are low and unusual circuit techniques are required to reliably detect contrast ratios resulting from data on the paper medium. Another advantage of using LED'S is that the type LED may be selected for various applications. No spectrum filters are necessary when the desired light wavelengths are produced directly by the light source. For example, visible red is ideal for detection of marks made by felt pens and ball-point pens of the black, blue, and green variety. Pencil marks may also be detected, however, if detection of pencil marking only is desired, than infrared LEDs are the preferably light source. Red ink marks can be detected by using LEDs which emit visible green light as the light sources.

SUMMARY OF THE INVENTION

The present invention pertains to circuitry specifically responsive to a silicon phototransistor and which circuitry (1) operates with very low reflected light magnitudes and (2) detects a selected contrast level and digitizes the information. Temperature compensation is employed to maintain a contrast threshold with environmental considerations.

It is therefore an object of the present invention to produce an electronic circuit which will detect reflected low level light.

It is another object of the present invention to produce a detection circuit which is independent of magnitude and responsive to ratios only.

It is another object of the present invention to produce a detection circuit which provides temperature compensation.

It is a further object of the present invention to produce an electronic circuit for detecting reflected low level light which circuit can be readily and economically manufactured.

The foregoing and other objects and advantages of the present invention will become apparent to those skilled in the art from the following detailed description taken with reference to the accompanying drawings.

DETAILED DESCRIPTION OF THE PREFERRED EMBODIMENT

Figure 1:
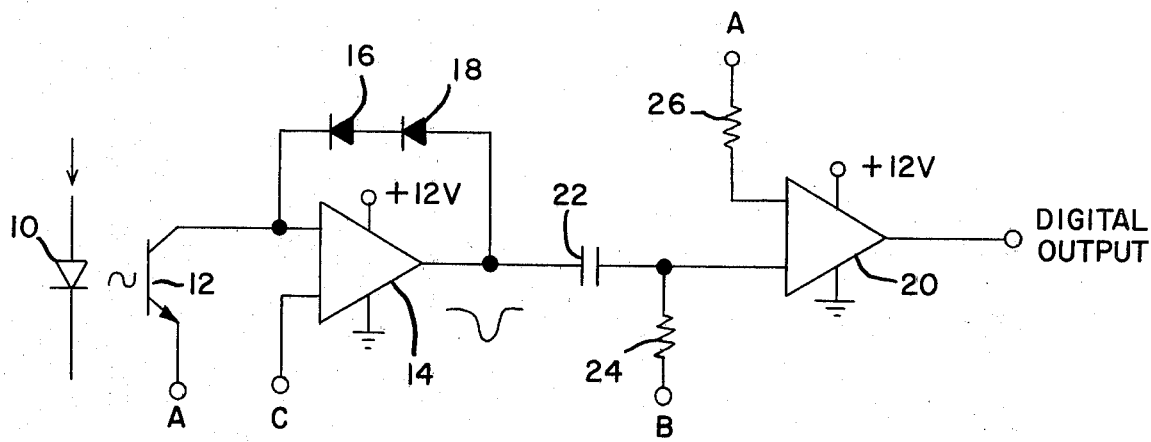
FIG. 1 is a schematic diagram of a read channel embodying the subject light detecting circuit.
Figure 2:
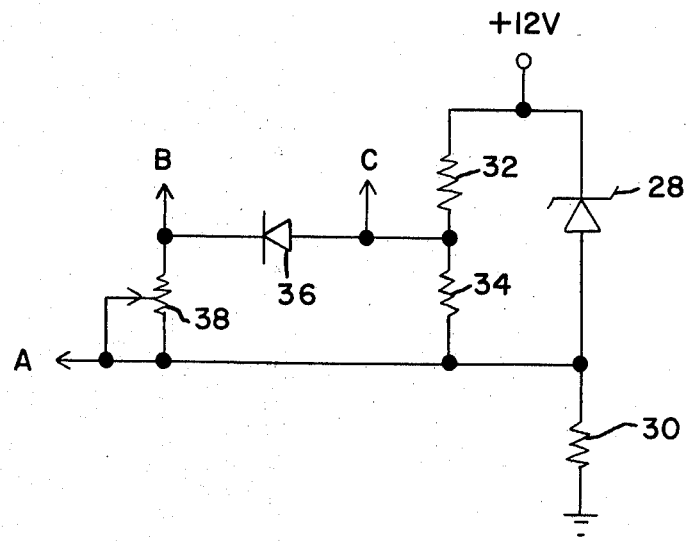
FIG. 2 is a schematic diagram of a bias network for the subject circuit.

Referring to the attached schematic drawings, a conventional LED 10 is connected as a light source with the reflected light emitted therefrom being detected by phototransistor 12. The output of the phototransistor 12 is connected to an input of an operational amplifier 14 which has a pair of series connected diodes 16, 18 connected between the output and input. The output of amplifier 14 is connected to the input of analog comparator 20 with capacitor 22 and resistors 24, 26 forming a high frequency pass filter between the amplifier and the comparator.

The biasing network comprises a zener diode 28 connected between a voltage source and ground through resistor 30. Resistors 32, 34 are series connected across zener diode 28 and diode 36 is connected between the juncture of resistors 32, 34 and potentiometer 38. The bias network has three outputs A, B and C which are appropriately connected to the read channel of FIG. 1.

The biasing network is arranged so that output C is one diode voltage drop above output A. Since the inverting (−) input of amplifier 14 will equal the non-inverting (+) input in voltage, the collector of phototransistor 12 is biased one diode voltage drop more positive than the emitter. This results in a collector to base voltage (Vcb) of zero for the phototransistor 12 and, therefore, there is no leakage current (Icbo). This allows operation of the phototransistor 12 at light current levels at or near ordinary leakage current levels.

The amplifier 14 is chose to have input current requirements well below the phototransistor 12 current levels. Therefore all of the light current flows through diodes 16 and 18. The dynamic output of amplifier 14 is the voltage change across diodes 16 and 18 resulting from light current changes.

The basic equation for a silicon diode in the forward direction is:

$$\Delta E = (nkt)/q \ln I_1/I_2$$

where K is Boltzmans constant, q is electronic charge, n is a function of the particular diode type (usually 1.0 to 1.3 ), T is absolute temperature and ln is natural logarithm. I1 and I2 represent the currents through the diode producing the voltage change.

An important point of the present invention is that the diode voltage change is independent of actual current magnitudes and depends on ratios only. Since light intensities will vary for many reasons (the particular LED used, LED aging, the particular phototransistor, the optical system, etc.) it is necessary to have a circuit which is ratio dependent rather than magnitude dependent.

The result is that light intensity ratios (contrast in light intensity) produce voltage changes at the output of amplifier 14 which are stable and predictable. These voltage changes are AC coupled to comparator 20 which has a selectable threshold (B minus A). When the light signal reaches this threshold, comparator 20 switches digital levels at its output.

Diode 36 of the bias network has a second purpose in providing temperature compensation to the threshold. With a 6.8 volt zener diode 28, approximately 2 ma. flows through resistor 32. At room temperature, diode 36 will drop about 600 MV and slightly more than this is forced across resistor 34. Therefore, about 1 ma.

flows through both diode 36 and resistor 34. Diode 36 will decrease about 2 MV per °C. in drop resulting in less current through resistor 34 and more through diode 36 with increasing temperature. The voltage drop across potentiometer 38 increases with increasing temperature, thus increasing the threshold. This compensates for the "T" or absolute temperature term in the basic diode equation making contrast detection relatively immune to temperature.

Normally, there are a multiplicity of optical channels for reading a multi-column card, for example twelve. The subject biasing network is common to all channels and one potentiometer 38 sets a contrast thereshold for all.

Two diodes 16 and 18 are employed to simply double the voltage changes and reduce errors due to offset voltage errors of inexpensive comparators when a multiplicity of channels are employed.

The electronics depicted presumes either a scanning technique or paper motion past a fixed optical reading head so that the contrast data is dynamic in nature.

Resistors 24 and 26 and capacitor 22 are chosen in value to preserve the lowest frequency components of interest and are small enought to reject slow background changes (shading variations or document flutter) which represent noise rather than signal. Only abrupt contrast changes are thus detected, such as is the case with marks on paper.

It may be pointed out that Quad operational amplifiers and Quad comparators are employed in a twelve channel system using only six total integrated circuits for data.

The present invention may be subject to many changes and modifications without departing from the spirit or essential characteristics thereof. The present embodiment should therefore be considered in all respects as illustrative and not restrictive of the scope of the invention.

What is claimed is:

1. In a reflective mode optical reader, an improved circuit for controlling a phototransister in such manner as to be responsive to low reflected ligh levels, said circuit comprising:
   a phototransister having its emitter connected to a bias voltage,
   an operational amplifier connected to the collector of said phototransister,
   a pair of series connected diodes connected across said operational amplifier, and
   bias voltage means applying bias voltage to said phototransister and said operational amplifier in such manner that said collector is biased one diode voltage drop more positive than said emitter so that collector to base voltage is zero and no leakage current present whereby the phototransistor is operational at current levels near ordinary leakage current levels.

2. The circuit according to claim 1 further comprising:
   an analog comparator having an input connected to the output of said operational amplifier whereby digital output is obtained.

3. The circuit according to claim 1 further comprising:
   a low frequency pass filter connected to the output of said operational amplifier.

4. The circuit according to claim 1 further comprising:
   temperature compensation means whereby said diode voltage drop changes with temperature.

5. The circuit according to claim 1 wherein said diode voltage drop is independent of actuated current magnitude whereby said circuit is ratio dependent.

6. The circuit according to claim 1 further comprising a plurality of optical channels all connected to a single bias voltage means.

* * * * *